United States Patent [19]

Busby

[11] Patent Number: 4,460,890
[45] Date of Patent: Jul. 17, 1984

[54] DIRECT DIGITAL TO DIGITAL SAMPLING RATE CONVERSION, METHOD AND APPARATUS

[75] Inventor: Bruce Busby, Mountain View, Calif.

[73] Assignee: Sony Corporation, Tokyo, Japan

[21] Appl. No.: 341,349

[22] Filed: Jan. 21, 1982

[51] Int. Cl.³ .............................................. H03K 13/24
[52] U.S. Cl. ............................. 340/347 DD; 364/724; 364/723
[58] Field of Search .............................. 364/724, 723; 340/347 DD

[56] References Cited

U.S. PATENT DOCUMENTS 3,639,848  2/1972  Elliott ........................ 340/347 R X

OTHER PUBLICATIONS

"A New Approach to Digital Sampling Frequency Conversion", Roger Lagadec and Henry O. Kunz, Switzerland, 3/1981.

"Architecture Development for a General Purpose Digital Filter", R. J. Karwoski, Published in 412 Digital Signal Processing by Integrated Computer System, Dec. 1979, pp. 2-3-1 to 2-3-16.

Primary Examiner—T. J. Sloyan
Attorney, Agent, or Firm—Limbach, Limbach & Sutton

[57] ABSTRACT

A direct digital-to-digital rate conversion apparatus and method for converting an input signal at a first sampling rate to an output signal at a second sampling rate, said apparatus has a rate multiplier means to increase the frequency of the input signal. The multiplied signals from the rate multiplied means are interpolated using a nth order n-polynomial interpolator to produce the output signal.

13 Claims, 10 Drawing Figures

• — INPUT SIGNAL
o — MULTIPLIED SIGNAL
--- — OUTPUT SIGNAL

$$s = \frac{\phi}{t}$$

DIRECT DIGITAL TO DIGITAL SAMPLING RATE CONVERSION, METHOD AND APPARATUS

BACKGROUND OF THE INVENTION

The present invention relates to a method and an apparatus for directly converting digital signals at a first sampling rate to digital signals at a second sampling rate.

In many applications of digital audio signals, due to conflicting sampling rates in different systems which are interconnected, a conversion between different sampling frequencies is necessary. For example, conversion between sampling frequency rates of 32.0 kHz to 44.1 kHz and to 50.1 kHz is required.

Heretofore, one technique for converting digital signals at one sampling rate to a different sampling rate has been accomplished by taking the intial digital signal and converting it to the analog domain through a D/A converter. The analog signal is the resampled and filtered at the desired output frequency and subsequently reconverted through an A/D converter back into a digital signal. This technique has the disadvantage that distortions due to nonlinearities, intermodulation, imperfect phase response, and noise are inherent in the system.

Direct digital to digital conversion, wherein the input digital signal and the output digital signals are in simple integer ratios has also been accomplished. In this technique, the frequency or the sampling rate of the input signal is increased by a frequency multiplier (typically implemented by means of an interpolating filter), resulting in a "conversion grid." Since the frequency ratio of the output signal to the input signal is a simple integer, and because the frequency multiplier was chosen to increase the frequency of the input signal at the same integer ratio, or an integer multiple thereof, the output signals would all be on the conversion grid. The grid can then be resampled at the desired output frequency to yield the output signals.

In a paper presented at the 68th Convention of the Audio Engineering Society held on Mar. 17–20, 1981 in Hamburg, West Germany, another approach to direct digital to digital frequency conversion was presented. In this paper, entitled "A New Approach to Digital Sampling Frequency Conversion" by Roger Lagadec, Henry O. Kunz, and Willi Studer, the authors proposed the use of multistage FIR digital filter for increasing the sampling frequency of the input signal. The frequency was increased by a factor of $2^{15}$ using four stages to form a conversion grid. The output sample is estimated by taking the nearest point on the conversion grid, by the technique of sample and hold, which is a zero-order interpolation. By this technique, conversion of input signal to an output signal, where the signals are at an arbitrary frequency ratio or at a frequency ratio which is not a simple integer, is possible.

SUMMARY OF THE INVENTION

Therefore, in accordance with the present invention, direct digital to digital sampling rate conversion for converting input digital signals at a first sampling rate to output digital signals at a second sampling rate, is accomplished by an apparatus which has a rate multiplication means into which the input digital signals are entered. A multiplied signal having a rate increased from the rate of the input signal is produced from the rate multiplication means. An interpolating means receives the multiplied signals from the rate multiplication means and interpolates the multiplied signals to produce the output signal. A timing signal generating means produces timing signals that regulate the generation of the multiplied signal and the output signal.

DETAILED DESCRIPTION OF THE DRAWINGS

Figure 1:
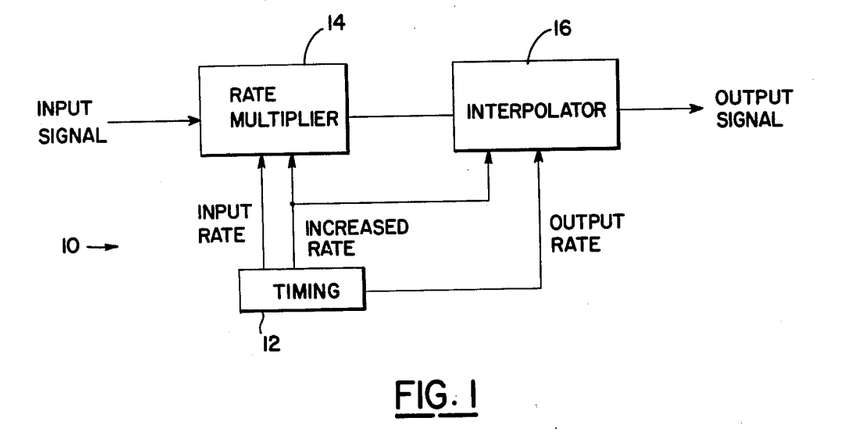
FIG. 1 is a schematic block diagram of the apparatus of the present invention.

Referring to FIG. 1, there is shown an apparatus 10 of the present invention. The apparatus 10 comprises a rate multipier 14 which receives an input signal. The rate multiplier 14 increases the sampling rate of the input signal and generates a multiplied signal at a rate increased from the input rate. The multiplied signal is entered into an interpolator 16. From the interpolator 16, the output signals are generated. The apparatus 10 further comprises a timing signal generator 12, which generates a timing signal which is at the same rate as the input signal, a timing signal which is at the same rate as the rate of the output signal and a timing signal at the increased rate, which is the frequency of the multiplied signal. The timing signals at the input rate and at the increased rate are entered into the rate multiplier 14. The timing signals at the output rate and at the increased rate are entered into the interpolator 16.

Figure 2:
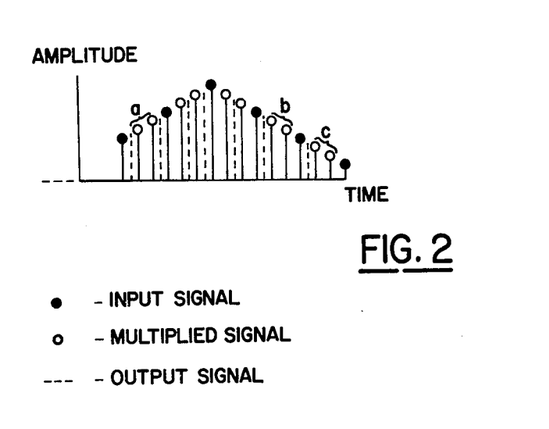
FIG. 2 is a graph of time versus signal amplitude for the input signal, the multiplied signal, and the output signal.

In the operation of the apparatus 10 of the present invention, the input digital signal is entered into the rate multiplier 14. This may be seen graphically in FIG. 2 wherein the input digital signals are shown as signals with filled-in circles. The rate multiplier 14 increases the sampling frequency of the input signal, producing the multiplied signal. In FIG. 2, the multiplied signals are shown as signals having open circles. From the rate multiplier 14, the multiplied signals are entered into the interpolator 16. The interpolator 16 selects the appropriate multiplied signals and based upon the output rate, produces the output signals therefrom. The output signals are shown as dashes in FIG. 2.

The rate multiplier 14 can be of any of the classically well-known digital multipliers, such as FIR digital filters. The multiplier 14 can be in a single stage or in a multistage. The timing signal generator 12 is also of well-known circuitry. For example, it can be a crystal controlled oscillator. Finally, the interpolator 16 is an nth order n-polynomial interpolator wherein n can be any integer from 1 to k, where k is a very large number. The degree of interpolation of the interpolator 16 is dictated by the amount of multiplication that the input signal has received from the rate multiplier 14 and the degree of accuracy desired for the output signal. If the rate multiplier 14 has increased the sampling rate of the input signal substantially, the interpolator 16 can be very simple, such as a simple linear interpolator. However, if the rate multiplier 14 has increased the sampling rate of the input signal by a slight amount, the interpolator 16 can be a quadratic interpolator or it can even be of a higher order interpolator.

The apparatus 10 of the present invention can be used to convert an input digital signal at a first sampling rate, such as 32 kHz, to a second sampling rate, such as 44.1 kHz, which are known and are in a fixed ratio. In such application, the interpolator 16 needs to receive only one timing signal from the timing signal generator 12. The timing signal needed can be either at the increased rate or at the output rate. Alternatively, the apparatus 10 can be used to convert an input digital signal at a first sampling rate to an output digital signal at a second sampling rate, with the rates of the signals in a variable ratio, i.e. signals whose sampling frequencies are not pre-determined.

Figure 3:
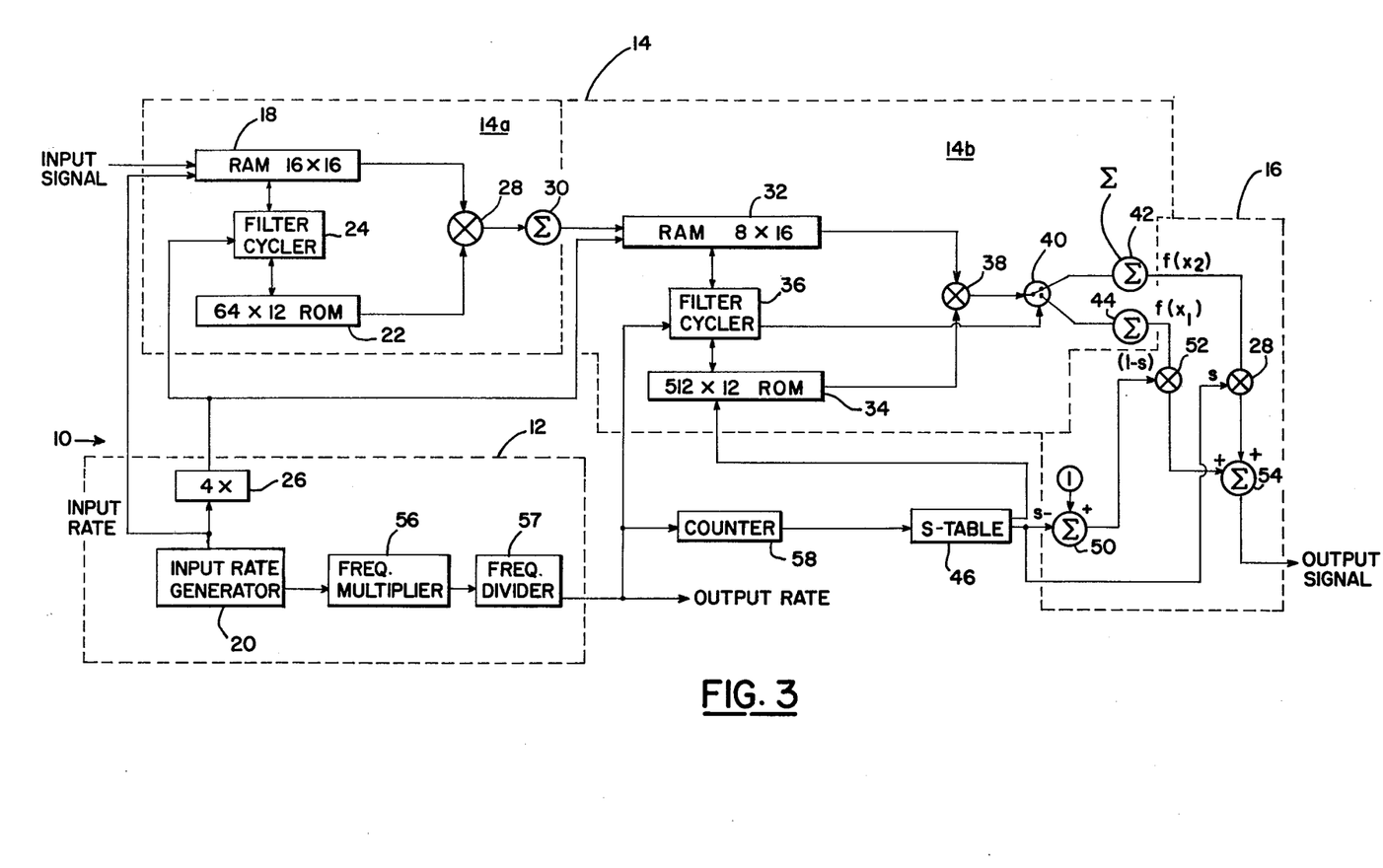
FIG. 3 is a schematic circuit diagram of one embodiment of the apparatus of the present invention which can convert an input signal to an output signal, with the rates of the signals in a fixed ratio.

Referring to FIG. 3 there is shown a schematic circuit diagram of the apparatus 10 of the present invention which can convert an audio input digital signal at the sampling rate of 32.0 kHz to an audio output digital signal at the sampling rate of 44.1 kHz. The apparatus 10 comprises a timing signal generating means 12, a rate multiplier means 14, and an interpolating means 16, all shown in dotted lines.

The rate multiplier means 14 is comprised of two stages: a first stage 14A which increases the input sampling rate by four times, and a second stage 14B which increases the rate of the signal from the first stage 14A by 64 times. Therefore, the total amount of multiplication of the rate multiplier means 14 is (4×64) or 256 times. The input signal is entered into the first stage 14A, which is a modified FIR digital filter. The input signal is clocked into a first 16×16 bit RAM memory 18 by a timing signal operating at the rate of the input signal. This timing signal is generated by the input rate generator 20 in the timing signal generating means 12. As is well known from FIR technology, a set of coefficients for the first stage rate multiplier 14A is generated beforehand by the filter designer. The coefficients must satisfy the criteria of a low-pass FIR filter with the bandwidth equivalent to the input base bandwidth. Well-known techniques, such as Kaiser window can be used. The coefficients generated beforehand are stored in a first ROM 22. The first ROM 22 is a 64×12 bit storage. Since the first stage 14 Amultiplies the rate of the input signal by four times, the number of coefficients stored in the first ROM 22 is four times that of the number of storage locations in the first RAM 18.

A first filter cycler 24 controls the operation of the first stage 14A. The input rate timing signal from the input rate generator 20 is increased in frequency by four times by the 4× frequency multiplier 26. The signal from the 4× frequency multiplier 26 is used to control the operation of the first filter cycler 24. At each timing signal from the 4× frequency multiplier 26, the first filter cycler 24 causes select signals in the first RAM 18 to be multiplied with select signals in the first ROM 22 by a first multiplier 28. The results of the multiplication are stored in a first accumulator 30, which forms a multiplied signal. After each multiplied signal, the timing signal from the 4× frequency multiplier 26 clears the first accumulator 30. After four multiplied signals are generated, a new input signal is clocked into the first RAM 18 and all the signals in the first RAM 18 are shifted one position.

The output of the first stage 14A, which is a multiplied signal operating at four times the sampling rate of the input signal, is entered into the second stage 14B of the rate multiplier means 14. In a manner similar to the first stage 14A, the multiplied signal is entered into a second RAM 32. The second RAM 32 has a storage capabilty of 8×16 bits. The second stage 14B increases the rate of the signal entering therein by a factor of 64; 512 coefficients are stored in the second ROM 34.

A second filter cycler 36, similar to the first filter cycler 24 within the first stage 14A, operates to select the particular location of the signal within the RAM 32 and the particular coefficient that is stored in the ROM 34 causing them to be multiplied by the second multiplier 38.

Once the signals are multiplied from the second multiplier 38, they are entered into a switch 40 which is under the control of the second filter cycler 36. From the switch 40, the signals enter into either a second accumulator 42 or into a third accumulator 44, depending upon the position of the switch 40. The second and third accumulators 42 and 44 are cleared by the output signal.

The outputs of the second accumulator 42 and third accumulator 44 form a pair of sample outputs that are entered into the interpolator 16. The sample pair of multiplied signal from the rate multiplier 14 that immediately bracket the expected output signal is chosen. By immediately bracketing the expected output signal, it is meant that one of the signals is immediately ahead of the output signal in time, while the other is immediately behind the output signal in time. As can be seen from FIG. 2, depending on the rate of multiplication by the multiplier section 14, and the rate of the output signal, not every multiplied signal needs to be entered into the interpolator 16. In FIG. 2, the multiplied signals designated as "A", "B", and "C" do not affect the output signal at all and do not need to be entered into the interpolator 16. Only a pair of sequential multiplied signals is entered into the interpolator 16, because the interpolator 16 is a linear interpolator. However, in the event the interpolator 16 performs a more complex interpolation process, more than two samples from the multiplier section 14 may be needed.

Figure 4:
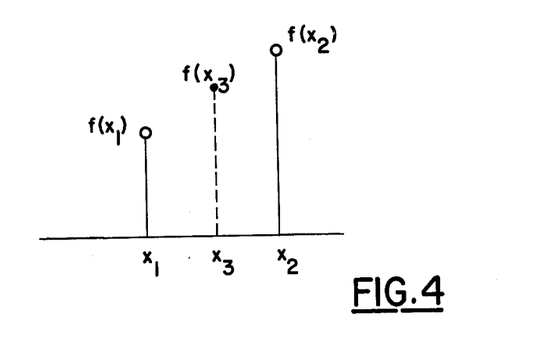
FIG. 4 is a graph illustrating the technique of linear interpolation.

The operation of the interpolator 16 can be understood as follows. From the second accumulator 42, the signal $F(x_2)$ is produced; and from the third accumulator 44, the signal $F(x_1)$ is produced. The signal $F(x_2)$ and the signal $F(x_1)$ are shown graphically in FIG. 4. Since the desired output signal $F(x_3)$ is known to be between these two signals, the interpolation process for a linear interpolator is based upon the following well-known formula:

$$F(X_3) = F(X_2) \frac{X_3 - X_1}{X_2 - X_1} + F(X_1) \left[ 1 - \frac{X_3 - X_1}{X_2 - X_1} \right]$$

If we let $S = \frac{X_3 - X_1}{X_2 - X_1}$ then the formula reduces to that of:

$$F(X_3) = F(X_2)*S + F(X_1)*(1-S)$$

In the apparatus 10, shown in FIG. 3, the values of S are provided from an S-Table 46. The particular value of S from the S-Table 46 is multiplied by the value $F(x_2)$ by a third multiplier 48. The particular value of S from the S-Table 46 is also entered into a difference accumulator 50, where it is subtracted from the value of 1. The output of the difference accumulator 50 is the term $(1-S)$, which term is entered into a fourth multiplier 52. The signal $F(x_1)$ is also entered into the fourth multiplier 52 and multiplies the term $(1-S)$. The output of the third multiplier 48 and of the fourth multiplier 52 are summed together in a fourth accumulator 54. The output of the fourth accumulator 54 is the value of $F(x_3)$ in accordance with the above stated formula.

The timing sequence and the generation of the values of S from the S-Table 46 may be understood as follows. The timing signal generator 12 comprises an input rate generator 20, and a 4× frequency multiplier 26 all as previously described. The input rate timing signal from the generator 20 is also entered into a frequency multiplier 56. The frequency multiplier 56 increases the rate of the input timing signal by 441 times. The 4× frequency multiplier 26 can also be part of the frequency multiplier 56. The circuitry for converting from one frequency to another can be a phase lock loop, with such technique being well-known in the art. From the frequency multiplier 56, the timing signal is divided 320 times by the frequency divider 57 to produce the output timing signal. The output timing signal is thus produced by increasing the input rate by four hundred forty one times (441) and then dividing the increased rate by three hundred twenty (320) times, i.e. 32 KHz * 441÷320=44.1 KHz.

The timing signal operating at the output rate is entered into the second filter cycler 36, causing it to generate the multiplied signals for use by the interpolator 16. However, unlike the first filter cycler 24 which generates four multiplied signals for each input signal, the second filter cycler 36 does not generate sixty-four multiplied signals for each signal from the first state 14a. Rather, the second filter cycler 36 generates only a pair of multiplied signals in response to each timing signal at the output rate.

Figure 10:
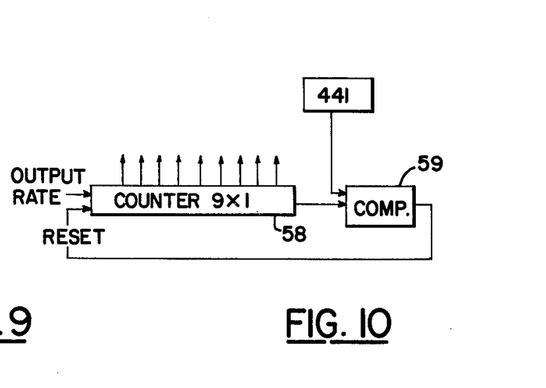
FIG. 10 is a schematic circuit diagram of the first counter used in the apparatus of the present invention.

The timing signal at the output rate is also entered into a first counter 58. With each timing signal, the first counter 58 is incremented by one. Referring to FIG. 10, it is seen that first counter 58 is a nine bit rapid counter, which counts up to the number four hundred forty-one (441), and is then reset. A comparator 59, compares the value of the first counter 58 to the value of 441 stored in a storage location. When the first counter 58 reaches the count 441, the comparator 59 resets the first counter 58.

Figure 6:
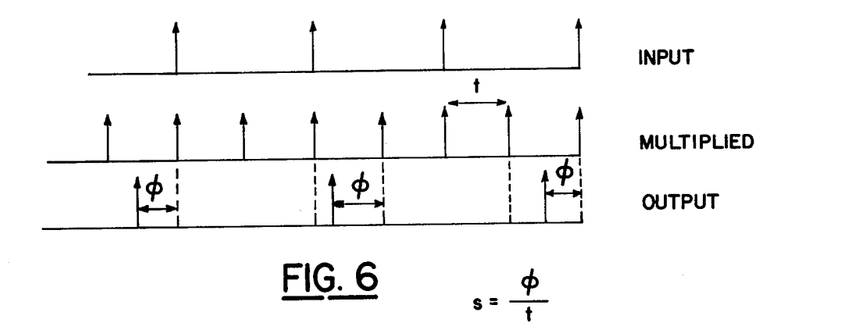
FIG. 6 is a graph of the timing relationship between the output signal, the multiplied signal, and the input signal.

The number four hundred forty-one is the minimum number of possible positions of the output signal in relation to the multiplied signal. It is the numerator of the lowest common denominator of the ratio of the output signal to the multiplied signal. For output signal sampling rate of 44.1 kHz and multiplied signal sampling rate of 4 * 64 * 32.0 kHz, the ratio of the two is 44.1 kHz/8,192 kHz with the lowest common denominator being 441/81,920. The numerator value of 441 is, therefore, all the possible values of timing relationship between the output signal and the multiplied signal. This is graphically shown in FIG. 6, where $\phi$ is the phase timing relationship between the output signal and the multiplied signal.

Figure 9:
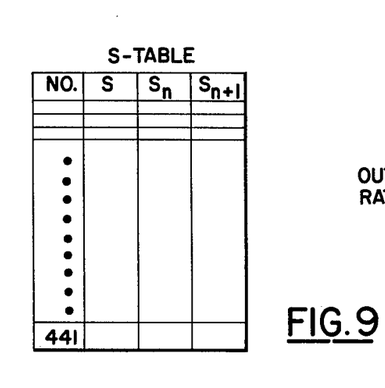
FIG. 9 is a table of the S-Table used in the apparatus of the present invention.

Since the input rate, multiplied rate, and the output rate are known, all the values of $\phi$ can be calculated beforehand. Since $S=\phi/t$ (see FIG. 6), all the values of S can be precalculated and stored in the S Table 46. Referring to FIG. 9, it is seen that the S-Table 46 has four hundred forty-one values of S stored therein. The output of the nine-bit first counter 58 is used to address the location within the S-Table 46 to supply the value of S for the interpolator 16, as previously described. Thus, the first counter 58 serves to direct to the particular value in the S-Table 46. For each value of S, there is also a pair of ROM address values $S_n$ and $S_{n+1}$. The ROM address values $S_n$ and $S_{n+1}$ are used by the second filter cycler 36 to generate the particular pair of multiplied signals for use in the interpolator 16, for each timing signal at the output rate The function of the second filter cycler 36 and the second stage 14b in using the ROM address values will be explained in detail hereinafter.

Because the second stage 14B produces only the pair of multiplied signals that is needed for use by the interpolator 16 in response to a timing signal operating at the output rate, saving in circuitry is achieved. Of course, as previously indicated, the number of multiplied signals used in the interpolator 16 is determined by the degree of complexity of the interpolator 16. A pair of multiply signals is used because the interpolator 16 is a linear interpolator.

Figure 5:
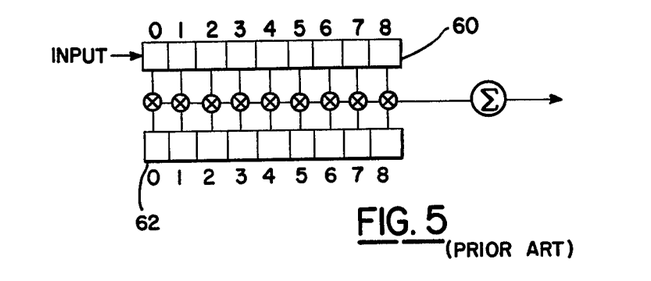
FIG. 5 is a schematic block diagram of an FIR digital filter of the prior art.

The multiplier section 14A or 14B of apparatus 10 is a modified FIR digital filter and differs from the FIR digital filter of the prior art in the following manner. Referring to FIG. 5, there is shown a block diagram of an FIR filter of the prior art. In the FIR filter of the prior art, the input signal is clocked into a shift register 60.

A ROM 62 contains the coefficients for the digital filter, exactly like the first ROM 22 or second ROM 34 of the multiplier 14. However, in the FIR filter of the prior art, there are as many storage locations in the shift register 60 as there are storage locations for the coefficients stored in the ROM 62. Moreover, the input signal is clocked into the shift register 60 at the increased rate-not at the input rate. The multiplied signals are produced by multiplying each position of the shift register 60 with its corresponding location in the ROM 62 and then summed, i.e., Multiplied signal = RAM(0) * ROM(0) + RAM(1) * ROM(1)

... + RAM(8) * ROM(8) or multiplied signal = $\sum_{I=0}^{8}$ RAM(I) * ROM(I)

(there being 9 positions in the shift register 60 and ROM 62 in the example shown in FIG. 5).

After each multiplied signal is produced, the shift register 60 is shifted one position, at the increased rate, and the next multiplied signal is again produced in accordance with the above-identified formula.

In contrast, in the apparatus 10 of the present invention, the input signal is entered into the first RAM 18 at the input rate. Moreover, the number of storage locations in the first ROM 22 is four times that of the number of storage locations in the first RAM 18 (four being the rate of multiplication for the first stage 14a). The theoretical basis of operation for the first stage 14a can be understood as follows.

If the first stage 14a was a FIR digital filter of the prior art, then the first RAM 18 would have 64 storage locations, the same number of storage locations as in the first ROM 22. The input signal would be clocked into the first RAM 18 at four times the input rate. Since the input signal is clocked into the first RAM 18 at a rate faster than the input rate, there would be zero's stored in the first RAM 18 between each adjacent input signals. In fact, there would be three zero's between each adjacent input signals. If we assume that positions 0, 4, 8, ... 60 in the first RAM 18 have input signal values, the other positions in the first RAM 18 would all be zero. The multiplied signal is produced in accordance with the previously stated formula; i.e., multiplied signal = RAM(0) * ROM(0) + RAM(1) * ROM(1) ... + RAM(63) * ROM(63)

However, since the first RAM 18 would have many locations with zero contained therein, the first multiplied signal would be:

multiplied signal = RAM(0) * ROM(0) + RAM(4) * ROM(4) ... + RAM(60) * ROM(60)   (1)

The next multiplied signal is produced by shifting the first RAM 18 one position, resulting in the input signals stored in locations 1, 5, 9, ... 61. The next multiplied signal would be multiplied signal = RAM(1) * ROM(1) + RAM(5) * ROM(5) ... + RAM(61) * ROM(61)   (2)

Repeating this process, the third and fourth multiplied signals would be multiplied signal = RAM(2) * ROM(2) + RAM(6) * ROM(6) + ... + RAM(62) * ROM(62)   (3)

multiplied signal = RAM(3) * ROM(3) + RAM(7) * ROM(7) + ... + RAM(63) * ROM(63)   (4)

From the above, it is seen that the value of RAM(0) is the same as the value of RAM(1), RAM(2) and RAM(3). In fact, in all four equations, all sixteen (16) values of the input signals remain the same. Thus, after each input signal is clocked into the first RAM 18, there is no need to shift them for the next three multiplied signals. Therefore, equations (1-4) are equivalent to 1st multiplied signal = RAM(0) * ROM(0) +
RAM(1) * ROM(4) +
... + RAM(15) * ROM(60)
2nd multiplied signal = RAM(0) * ROM(1) +
RAM(1) * ROM(5) +
... + RAM(15) * ROM(61)
etc.

or multiplied signal = $\sum_{I=0}^{15}$ RAM(I) * ROM(4*I + OFFSET)

where OFFSET is an integer between 0 and 3 with the input signal clocked into the first RAM 18 at the input rate.

Because of the discovery of the foregoing equivalence in signal generation, the circuitry used to implement the modified FIR digital filter used in the apparatus 10 of the present invention can be greatly simplified. In particular, it should be noted that the generation of a multiplied signal in the apparatus 10 of the present invention requires only sixteen multiplication/summation steps, whereas prior art FIR digital filter would require sixty-four steps.

Figure 7:
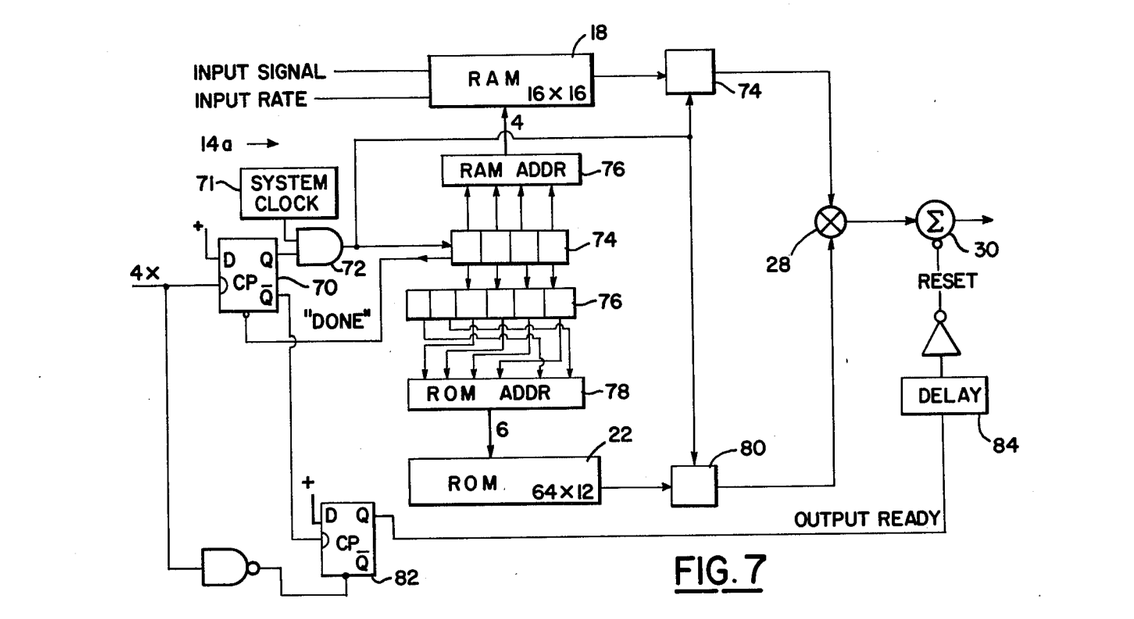
FIG. 7 is a schematic circuit diagram of the first stage multiplier used in the apparatus of the present invention.

Referring to FIG. 7, there is shown a schematic circuit diagram of the first stage 14a employing a modified digital FIR filter. It should be emphasized, however, that the circuit diagram shown in FIG. 7 in only one of a multitude possible circuits to implement the first stage 14a. The first stage 14a can be implemented by the prior art FIR filter technique or it can be implemented by the modified FIR filter, as shown in FIG. 7. Moreover, designs of FIR filters are well known; see, e.g., "Architecture Development For A General Purpose Digital Filter" by R. J. Karwoski, 412 *Digital Signal Processing by Integrated Computer System*, published December 1979, page 2-3-1, which is incorporated herein by reference.

In FIG. 7, the 4× timing signal is supplied to a first flip-flop 70. The Q output of the first flip-flop 70 is supplied to a first AND gate 72. The other input to the first AND gate 72 is a timing signal from the system clock 71. The system clock 71 can be part of the timing signal generator 12. The function of the system clock 71 is to supply a timing signal at a rate fast enough to accomplish the requisite multiplication and summation steps for each timing signal at the 4× rate. For the example shown in FIG. 3 (i.e. 32.0 kHz to 44.1 kHz), the system clock 71 must be faster than 3.84 MHz. The result of the first AND gate 72 is a timing signal operating at the system clock 71 and is supplied to a second counter 74. Because of the first flip-flop 70, timing signals from the system clock 71 are not produced until a signal at the 4× rate has been received by the first stage 14a. The second counter 74 is a four bit counter. Thus, it counts from the number 0000 to the number 1111 (or in decimal from 0-15). After the second counter 74 has cycled through 16 counts, it sends a done signal to the first flip-flop 70, resetting it thereby turning off the system clock 71.

The value in the second counter 74 is supplied to a RAM Addressor 76 which uses that value to address the particular storage location in the first RAM 18 and stores that value in a first latch 74. The function of the first latch 74 is to simply act as a delay and to hold the value for the first multiplier 28. The value of the second counter 74 is also supplied to a third counter 76. The third counter 76 is a six-bit counter. The four bits of the second counter 74 are supplied to the four least significant bits of the six-bit counter 76. A first ROM Addressor 78 takes the six bits from the third counter 76 and selects the particular value within the first ROM 22 and stores it in the second latch 80. The first ROM Addressor 78 takes the four least significant bits of the third counter 76 and uses those four bits as the four most significant bits, while the two most significant bits of the third counter 76 are used as the two least significant bits for the ROM Addressor 78.

The values stored within the first and second latches 74 and 80, respectively, are used by the first multiplier 28 and the result of the multiplication process is supplied to the first accumulator 3. After each timing signal from the system clock 71, the first and second latches 74 and 80, respectively, are reset by the subsequent signal from the system clock 71. After each 4× timing signal, the $\overline{Q}$ output of the first flip-flop 70 is sent to a second flip-flop 82 which sends an output ready signal to the first accumulator 30. The output ready signal is delayed by a first delay 84 which then resets the first accumulator 30.

The operation of the first stage 14a can be understood as follows. After the first 4× timing signal is received, the second counter 74 would have the value (0000), the third counter 76 would have the value (000000), assuming that the two most significant bits of that counter are (00). First latch 74 would contain the value RAM(0) while second latch 80 would contain the value ROM(0). These values are used by the first multiplier 28 to produce the value: RAM(0) * ROM(0).

After a timing signal is generated by the system clock 71, the second counter 74 would have the value (0001). The third counter 76 would have the value (000001). The ROM ADDR 78, however, would address the location (000100) or ROM(4). Thus, the first multiplier 28 would multiply the values of RAM(1) and ROM(4). The result is added to the first accumulator 30 all in accordance with equation (1). The subsequent timing signals from the system clock 71 would have the following effect:

| Second Counter 74 | RAM ADDR | Third Counter 76 | Entering Into ROM ADDR | ROM ADDR |
|---|---|---|---|---|
| 0010 | 2 | 00 0010 | 0010 00 | 8 |
| 0011 | 3 | 00 0011 | 0011 00 | 12 |
| 0100 | 4 | 00 0100 | 0100 00 | 16 |
| 0101 | 5 | 00 0101 | 0101 00 | 20 |
| 0110 | 6 | 00 0110 | 0110 00 | 24 |
| 0111 | 7 | 00 0111 | 0111 00 | 28 |
| 1000 | 8 | 00 1000 | 1000 00 | 32 |
| 1001 | 9 | 00 1001 | 1001 00 | 36 |
| 1010 | 10 | 00 1010 | 1010 00 | 40 |
| 1011 | 11 | 00 1011 | 1011 00 | 44 |
| 1100 | 12 | 00 1100 | 1100 00 | 48 |
| 1101 | 13 | 00 1101 | 1101 00 | 52 |
| 1110 | 14 | 00 1110 | 1110 00 | 56 |
| 1111 | 15 | 00 1111 | 1111 00 | 60 |

After all sixteen multiplication steps have been performed and summed in the first accumulator 30, the multiplied signal is supplied to the second RAM 32.

With the second 4× timing signal, the operation of the first stage 14a proceeds as before. However, the third counter 76 would begin with the value (010000). (Previously, it ended on the value 001111. With another system clock timing signal, the third counter 76 would begin with 010000). Using the two most significant bits of the third counter 76 as the two least significant bits for the ROM ADDR 78 means that the ROM ADDR 78, on the second 4× timing signal, would be addressing the same locations as during the first 4× timing signal but with an offset of 1. Thus, with the second 4× timing signal, the ROM ADDR 78 would address the locations of 1, 5, 9, . . . 61. This is in accordance with equation (2) above.

On the third 4× timing signal, the third counter 76 would being with the value (10 0000). This would result in an offset of 2 and the ROM ADDR 78 would address locations 2, 6, 10 . . . 62.

On the fourth 4× timing signal, the third counter 76 would begin with the value of (11 0000), providing the necessary offset. On the fifth 4× timing signal, a new input signal would be clocked into the first RAM 18. In addition, the third counter 76 would return to the value of (000000).

Figure 8:
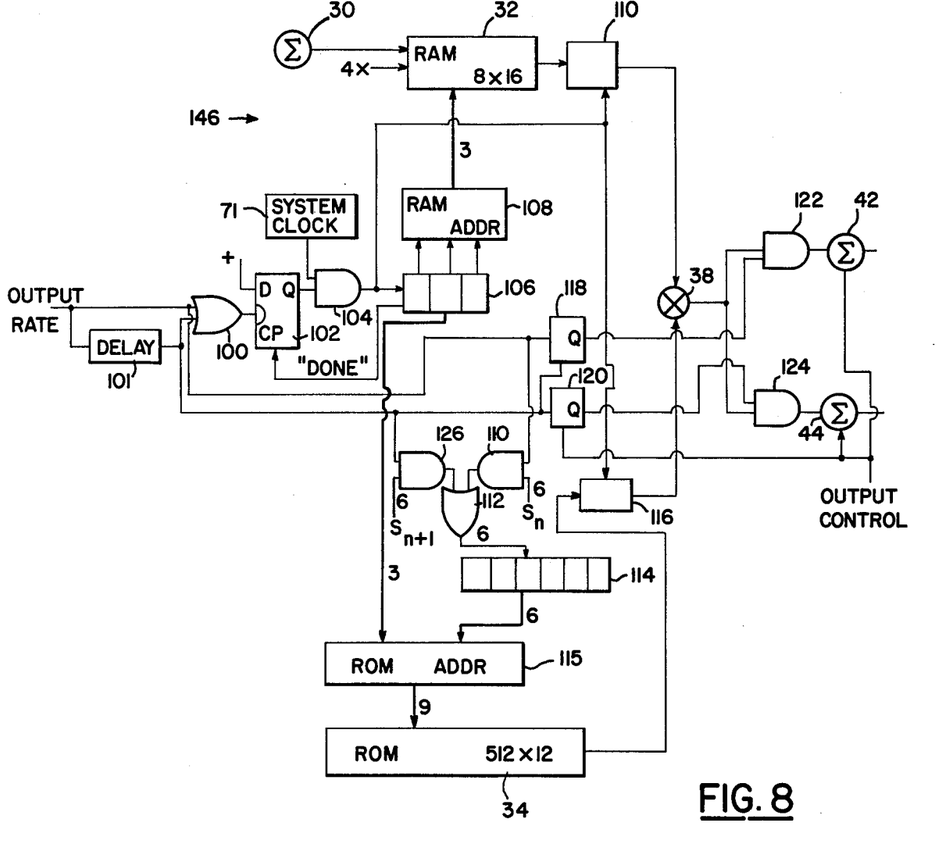
FIG. 8 is a schematic circuit diagram of the second stage multiplier used in the apparatus of the present invention.

The theoretical basis for the second stage 14b is as follows. Similar to the analysis set forth heretofore, for each 4× timing signal, the second stage 14b is capable of producing sixty-four (64) multiplied signals. They are $$\text{1st multiplied signal} = \text{RAM(0)} * \text{ROM(0)} + \text{RAM(1)} * \text{ROM(64)} + \ldots \text{RAM(7)} * \text{ROM(448)} \quad \text{eq.(5)}$$

$$\text{2nd multiplied signal} = \text{RAM(0)} * \text{ROM(1)} + \text{RAM(1)} * \text{ROM(65)} + \ldots \text{RAM(7)} * \text{ROM(449)} \quad \text{eq.(6)}$$

$$\text{3rd multiplied signal} = \text{RAM(0)} * \text{ROM(2)} + \text{RAM(1)} * \text{ROM(66)} + \ldots \text{RAM(7)} * \text{ROM(450)} \quad \text{eq.(7)}$$

$$\vdots$$

$$\text{64th multiplied signal} = \text{RAM(0)} * \text{ROM(63)} + \text{RAM(1)} * \text{ROM(127)} + \ldots \text{RAM(7)} * \text{ROM(512)} \quad \text{eq.(8)}$$

$$\text{or multiplied signal} = \sum_{I=0}^{7} \text{RAM(I)} * \text{ROM}(64*I + \text{OFFSET})$$

where OFFSET is an integer between 0 and 63

However, as previously stated, these sixty-four multiplied signals are not produced. Instead, these multiplied signals are predetermind and are known to the filter designer. In response to a timing signal at the output rate, only a pair of multiplied signals that immediately bracket the output timing signal is produced by the second stage 14b.

Referring to FIG. 8, there is shown a schematic circuit diagram of the second stage multiplier 14b of the present invention. Timing signals at the output rate are supplied to a first OR gate 100. From the first OR gate 100, timing signal at the output rate triggers a third flip-flop 102. The Q output of the third flip-flop 102 is supplied to a second AND gate 104. The other input to the second AND gate 104 is timing signal from the system clock 71, which is the same system clock 71 as described in FIG. 7. From the second AND gate 104, timing signals at the system clock rate are supplied to a fourth counter 106. The fourth counter 106 is a three-bit counter. The value of the fourth counter 106 is used by the second RAM ADDR 108 to address the locations within the second RAM 32. The particular value within the second RAM 32 is then supplied to a third latch 110, which is used by the second multiplier 38 to generate the multiplied signal.

The timing signal at the output rate is also supplied to a third AND gate 110. The other input to the third AND gate 110 is the value of $S_n$ supplied from the S-Table 46. Since the ROM address $S_n$ supplied from the S-Table 46 is a six-bit number, the third AND gate 110 should be comprised of six AND gates. However, for illustrative purposes, it is shown as a single AND gate. Therefore, when the output timing signal is received by the second stage 14b, the particular value of the ROM address $S_n$, is passed through the third AND gate 110 and the second OR gate 112 into the fifth counter 114. The second ROM ADDR 115 uses three bits from the fourth counter 106 and six bits from the fifth counter 114 to address the particular location within the second ROM 34 and supply it to a fourth latch 116. The ROM ADDR 115 uses the six bits from the fifth counter 114 as the six least significant bits for the nine-bit address, while the three bits from the fourth counter 106 are used as the three most significant bits for the nine-bit address. The values contained within the third and fourth latches 110 and 116, respectively, are used by the second multiplier 38.

Timing signal at the output rate is also supplied to a fifth latch 118. The Q output of the fifth latch 118 is supplied to a fourth AND gate 122. The other input to the fourth AND gate 122 is the output of the second multiplier 38. Thus, when the timing signal at the output rate is received by the second stage 14b, the output of the second multiplier 38 is passed through the fourth AND gate 122 into second accumulator 42. Once the timing signal at the output rate is received by the second stage 14b, the system clock 71 supplies timing signals to cycle the fourth counter 106 through eight counts sufficient to supply eight values from the second RAM 32 and eight values from the second ROM 34 to be multiplied together by the second multiplier 38 and summed in the second accumulator 42. The output timing signal then produces one multiplied signal.

The output timing signal is also passed through a second delay 101. The delay 101 must be of sufficient time duration so that the multiplied signal generated by the output timing signal can be produced and stored in the second accumulator 42. The delayed output timing signal is also supplied to a first OR gate 100 which triggers the fourth flip-flop 102. The delayed output timing signal causes the system clock 71 to generate another series of eight clock pulses into the fourth counter 106. Similar to the operation of the output timing signal, the delayed output timing signal causes selective values within the second RAM 32 to be stored in the third latch 110 for use by the second multiplier 38.

The delayed output timing signal also causes the ROM address $S_{n+1}$ from the S-Table 46 to be passed through a fifth AND gate 126, through the second OR gate 112 into fifth counter 114. Similar to the operation of the ROM ADDR 115 during the operation of the output timing signal, the ROM ADDR 115 during the delayed output timing signal takes the values from the fourth and fifth counters 106 and 114, respectively, and selects the value from the second ROM 34 and supplies it to the fourth latch 116.

The delayed output timing signal also resets the fifth latch 118, turning it off. At the same time, it sets the sixth latch 120, turning it on, permitting the results of the multiplication within the second multiplier 38 to be passed into the third accumulator 44. The output signal from the interpolator 16 is used to reset the sixth latch 120, and the second and third accumulators 42 and 44, respectively. In addition, similar to the operation of the first stage 14a, the timing signal from the system clock 71 is used to reset the third and fourth latches 110 and 116, respectively, after each system clock timing signal.

The operation of the second stage 14b is as follows: When a timing signal at the output rate is produced, the first counter 58 is incremented and the value thereof is used by the S-Table 46 to produce the values of S, $S_n$, and $S_{n+1}$. As previously indicated, because the input rate, output rate and multiplied rate are known, the particular values of S, $S_n$ and $S_{n+1}$ for each timing signal at the output rate can be precalculated. Thus, let us assume that the filter designer knows beforehand that for this particular output timing signal, it would lie in time between the second (eq. (6)) and third (e.q.(7)) multiplied signals. The values of $S_n$ and $S_{n+1}$ from the S-Table 46 would be 1 and 2, respectively. The value of $S_n$ is first supplied to the fifth counter 114. With each system clock timing signal, the following occurs:

| Fourth Counter | RAM ADDR | Entering Into ROM ADDR | ROM ADDR |
|---|---|---|---|
| 000 | 0 | 000 000001 | 1 |
| 001 | 1 | 001 000001 | 65 |
| 010 | 2 | 010 000001 | 129 |
| 011 | 3 | 011 000001 | 193 |
| 100 | 4 | 100 000001 | 257 |
| 101 | 5 | 101 000001 | 321 |
| 110 | 6 | 110 000001 | 385 |
| 111 | 7 | 111 000001 | 449 |

The multiplied signal in accordance with equation (6) is produced.

With the generation of the delay output timing signal, the value of $S_{n+1}$ is loaded into the fifth counter 114. A multiplied signal in accordance with equation (7) is produced.

The values of $S_n$ and $S_{n+1}$ serve as offset values to direct to the particular address within the second ROM 34 to produce the multiplied signals. Since the offset is a number between 0 and 63, the values of $S_n$ and $S_{n+1}$ are six bit numbers. In addition, because $S_{n+1}-S_n$ is always equal to 1, the S-Table 46 need not contain all the values of both $S_n$ and $S_{n+1}$. The S-Table 46 can contain all the values of $S_n$ and supply the particular value of $S_n$ to the second stage 14b upon an output timing signal. When a delay output timing signal is produced, it can additionally be used to increment the value of $S_n$ by 1 to arrive at $S_{n+1}$.

Of course, rate multipliers, other than FIR filters, can be used. In addition, the interpolator 16 can be more than a simply a linear interpolator. The multipliers 28, 38, 48 and 52 can be well known hard wire digital arithmetic units. The accumulators 30, 42, 44, 54 and 50 are also well known hard wire digital arithmetic units.

What is claimed is:

1. A method for directly converting an input digital signal at a first sampling rate to an output digital signal at a second sampling rate, said method comprising the steps of generating a timing signal at the first rate, at the second rate, and at an increased rate, said increased rate being an integral multiple of the first rate;

clocking the input signal into a first storage means at the first rate;

multiplying a value of the input signal in a select storage location in said first storage means with a predetermined value in a select storage location in a second storage means to produce a multiplication result; and summing a plurality of the multiplication results to produce an increase signal in accordance with:

$$\text{increased signal} = \sum_{I=0}^{N} \text{RAM}(I) * \text{ROM}(K * I + \text{Offset})$$

where:
- RAM(I) is the value of the first storage means in the Ith storage location;
- ROM(K * I+Offset) is the value of the second storage means in the K * I+Offset storage location;
- K is said integral multiple;
- Offset is a number from 0 to K−1;
- N is the discrete number of storage locations; and interpolating the increased signal to produce the output signal.

2. The method of claim 1 wherein said interpolating steps comprises linearly interpolating said increased signal.

3. The method of claim 2 wherein said interpoating step interpolates a pair of increased signals.

4. A direct digital to digital sampling rate conversion apparatus for converting an input digital signal having a first sampling ratee to an output digital signal having a second sampling rate, said apparatus comprising:

a timing signal generating means for producing timing signals at said first rate, at an increased rate which is an integral multiple of said first rate, and at said second rate;

rate multiplication means having a first storage means with a discrete number of storage locations for receiving said input digital signal, a second storage means for storing a predetermined number of coefficients, said second storage means having a number of storage locations at least equal to said discrete number times said integral multiple; a multiplier means for generating a plurality of multiplied signals by multiplying select values in said first storage means with values in said second storage means; and an accumulator means for summing said multiplied signals;

and wherein said rate multiplication means receives timing signals at said first rate, and at said increased rate and produces an increased digital signal at said increased rate in accordance with:

$$\text{increased signal} = \sum_{I=0}^{N} \text{RAM}(I) * \text{ROM}(K * I + \text{Offset})$$

where:
- RAM(I) is the value of the first storage means in the Ith storage location;
- ROM(K * I+Offset) is the value of the second storage means in the K * I+Offset storage location;
- K is said integral multiple;
- Offset is a number from 0 to K−1;
- N is the discrete number of storage locations; and interpolating means for receiving said increased signal and said timing signal at said second rate and for interpolating said increased signal to produce said output signal.

5. The apparatus of claim 4 wherein said apparatus further comprises
- counter means for receiving and counting said timing signal at said second rate;
- table means for storing a plurality of values of the relative positions of the second rate timing signals to said increased rate timing signals, and for storing a plurality of storage address values, one storage address value for each value of the relative position;
- said table means in response to the count in said counter means, supplying a stored value of the relative position to said interpolating means, and supplying a storage address value to said rate multiplication means.

6. The apparatus of claim 4 wherein said first rate and said second rate are in a variable ratio.

7. The apparatus of claim 4 wherein said interpolating means is an Nth order N-polynomial interpolator.

8. The apparatus of claim 4 wherein said first rate and second rate are predetermined.

9. The apparatus of claim 4 wherein said rate multiplication means comprises a plurality of rate multipliers.

10. The apparatus of claim 4 wherein said rate multiplication means further comprises:
filter cycle means for selecting an input signal in said first storage means for multiplication by a coefficient in said second storage means.

11. The apparatus of claim 7 wherein N equals 1.

12. The apparatus of claim 10 wherein said first storage means is a RAM.

13. The apparatus of claim 5 wherein said interpolating means receives said timing signal at said second rate and receives a pair of increased signals and produces said output signal therefrom.

* * * * *